(12) United States Patent
Kang

(10) Patent No.: US 6,181,640 B1
(45) Date of Patent: Jan. 30, 2001

(54) CONTROL CIRCUIT FOR SEMICONDUCTOR MEMORY DEVICE

(75) Inventor: Ku Chang Kang, Ichon-shi (KR)

(73) Assignee: Hyundai Electronics Industries Co., Ltd. (KR)

(*) Notice: Under 35 U.S.C. 154(b), the term of this patent shall be extended for 0 days.

(21) Appl. No.: 09/307,933

(22) Filed: May 10, 1999

Related U.S. Application Data

(63) Continuation-in-part of application No. 09/103,292, filed on Jun. 23, 1998, now abandoned.

(30) Foreign Application Priority Data

Jun. 24, 1997 (KR) .................................. 97-26972

(51) Int. Cl.[7] ........................................ G11C 8/00
(52) U.S. Cl. .................. 365/233.5; 365/203; 365/210; 365/230.06
(58) Field of Search ............................. 365/233.5, 210, 365/189.05, 203, 230.06

(56) References Cited

U.S. PATENT DOCUMENTS

| | | |
|---|---|---|
| 4,937,792 | 6/1990 | Suzuki et al. . |
| 4,939,691 | 7/1990 | Mizukami et al. . |
| 4,962,487 | 10/1990 | Suzuki . |
| 5,245,585 * | 9/1993 | Voss et al. .................... 365/238.5 |
| 5,258,952 | 11/1993 | Coker et al. . |
| 5,559,737 * | 9/1996 | Tanaka et al. ................. 365/185.25 |
| 5,650,978 | 7/1997 | Ukita et al. . |
| 5,745,431 * | 4/1998 | Pontius et al. ................ 365/233.5 |

* cited by examiner

Primary Examiner—David Nelms
Assistant Examiner—Thong Le
(74) Attorney, Agent, or Firm—Blakely Sokoloff Taylor & Zafman

(57) ABSTRACT

There is provided a semiconductor memory device capable of reducing the power consumption during write operation. The semiconductor memory device comprises: an address transition detector for detecting a transition of an address signal externally applied thereto and producing a precharge signal having a first predetermined active duration; a dummy bit line unit for producing a dummy bit line signal in response to an activation of at least one word line; a pulse generator for generating a pulse, the pulse signal becoming active in response to both an activation of a write enable signal externally applied and a de-activation of the precharge signal, and the pulse signal having a second predetermined active duration; a latch for producing a latch signal, the latch signal being reset in response to the precharge signal or the pulse signal and being set in response to the dummy bit line signal; and a write signal generator for producing a write signal, the write signal becoming active in response to the latch signal and becoming non-active in response to the latch signal, wherein the data externally applied is transferred to the memory cell through the bit line only when the write signal is active. This device may further comprises a sense enable signal generator for producing a sense enable signal by delaying and inverting the latch signal, and an address decoder enable signal generator for producing an address decoder enable signal, address decoder enable signal becoming active in response to the precharge signal and becoming non-active in response to the latch signal.

17 Claims, 7 Drawing Sheets

US 6,181,640 B1

CONTROL CIRCUIT FOR SEMICONDUCTOR MEMORY DEVICE

C.I.P of Ser. No. 09/103,292 filed Jun. 23, 1998 abandoned.

BACKGROUND OF THE INVENTION

The present invention relates to a control circuit for semiconductor memory device, more particularly to a control circuit capable of reducing power consumption by controlling WRITE operation of SRAM (Static Random Access Memory).

Generally, SRAM memory cell includes a flip-flop circuit for data storage and two switch elements (e.g. two access transistors). In SRAM, if the access transistors are applied with a pulse through a word line so that the cell transistor is turned on, access for data writing or reading to/from the memory cell can be made. In addition, if the write signal is active (e.g. "high" level), data transfer can be made between a pair of bit lines and a pair of data bus lines.

In addition, the data of SRAM is statically maintained to a cell without any refresh operation due to the feedback effect of the flip-flop included therein, as long as the power is supplied thereto. This is contrary to that of DRAM.

FIG.1 is a circuit diagram illustrating a conventional SRAM of a semiconductor memory device, which includes a dummy bit line unit.

Referring to FIG. 1, the reference character 60 represents the dummy bit line unit and the reference character 80 represents a memory circuit unit (e.g. SRAM circuit unit) including memory cell array. The SRAM circuit unit 80 includes NMOS transistors NM1 and NM2 for bit line precharging, NMOS transistors NM3 and NM4 for bit line static precharging, a plurality of memory cells 10, NMOS transistors NM5 and NM6 for column selecting, and a sense amplifier 20. Each of the NMOS transistors NM1 and NM2 has a gate applied with a precharge signal PRE. Thus, the NMOS transistors NM1 and NM2 are turned on by the high level of the precharge signal PRE, which in turn, precharge the bit line BL and the inverted bit line /BL, respectively. The static precharge NMOS transistor NM3 is diode-coupled from the power signal VDD to the bit line BL and the static precharge NMOS transistor NM4 is diode-coupled from the power signal VDD to the inverted bit line /BL. The memory cell 10 is coupled between the bit line BL and the inverted bit line /BL. Each of the NMOS transistors NM5 and NM6 has a gate applied with a column signal COL for selecting the bit line and the inverted bit line /BL, respectively. The sense amplifier 20 is coupled between a data bus line DBL and an inverted data bus line /DBL and is activated by a sense enable signal SE to sense and amplify the data.

The dummy bit line unit 60 of FIG. 1 produce an inverted dummy bit line signal /S1 in response to the precharge signal PRE from an address signal transition detector (see FIG. 2) and a plurality of word line signals WL[M-1:0] from a word line signal generator (not shown). The dummy bit line unit 60 comprises an NMOS transistor NM62 whose drain-source path is coupled between the power voltage VDD and the dummy bit line DUBL and whose gate is applied with the precharge signal PRE; a plurality of NMOS transistors NM64, NM66 and NM68 each drain-source path being coupled between the dummy bit line DUBL and the ground and each gate being applied with the corresponding word line signal WL[M-1:0], respectively; and an inverter IV62 whose input is coupled to the dummy bit line DUBL for producing the inverted dummy bit line signal /S1.

In addition, the memory cell array of conventional SRAM further includes NMOS transistors NM7 and NM8 for write operation, two CMOS inverters 30 and 40. Each of the NMOS transistors NM7 and NM8 has a gate applied with an internal write signal WR and is activated the high level of the write signal WR, that is the duration for write operation. The CMOS inverter 30 includes a PMOS transistor PM1 and an NMOS transistor NM9 coupled, in series, between the power voltage VDD and ground VSS. Also, the output of the CMOS inverter 30 is coupled to the drain of NMOS transistor NM8 and the input thereof is coupled for receiving a data input signal DIN. The CMOS inverter 40 includes a PMOS transistor PM2 and an NMOS transistor NM10 coupled in series, between the power voltage VDD and ground VSS. Also, the input of the CMOS inverter 40 is coupled to the output of the CMOS inverter 30 and the output thereof is coupled to the drain of the NMOS transistor NM7.

In the meantime, the bit line BL is coupled between the NMOS transistor NM1 for bit line precharge and the NMOS transistor NM5 for selecting a column, while the inverted bit line /BL is coupled between the NMOS transistor NM2 for precharging and the NMOS transistor NM6 for selecting. The data bus line DBL is coupled between the NMOS transistor NM5 for selecting and the NMOS transistor NM7 for writing, while the inverted data bus line /DBL is coupled between the NMOS transistor NM6 for selecting and the NMOS transistor NM8 for writing.

The memory cell 10 includes two PMOS transistors PM3 and PM4, and four NMOS transistors NM11, NM12, NM13 and NM14. The memory cell 10 further includes two storage nodes N1 and N2. The PMOS transistor PM3, the storage node N1 and the NMOS transistor NM11, are coupled in series, between the power voltage VDD and the ground VSS. Likewise, the PMOS transistor PM4, the storage node N2 and the NMOS transistor NM12, are coupled in series, between the power voltage VDD and the ground VSS. For the NMOS access transistor NM13, the gate thereof is coupled to the corresponding word line WL and the source-drain path thereof is coupled between the storage node N1 and the bit line BL. Also, for the NMOS access transistor NM14, it's gate is coupled to the word line WL and it's source-drain path is coupled between the storage node N2 and the inverted bit line /BL.

In addition, in the memory cell 10, the gates of the PMOS transistor PM3 and the NMOS transistor NM11 are coupled to the storage node N2, while the gates of the PMOS transistor PM4 and the NMOS transistor NM12 are coupled to the storage node N1.

The operation of conventional SRAM of semiconductor memory device having the structure as described above will be explained.

If the high level of the precharge signal PRE is applied to the gates of the precharge NMOS transistors NM1 and NM2, the NMOS transistors NM1 and NM2 should turned on so as to precharge the bit line BL and the inverted bit line /BL, respectively.

If the precharge signal PRE is "high" state, the NMOS transistor NM62 of the dummy bit line unit 60 is turned on so that the dummy bit line DUBL is precharged to "high" level and the inverted dummy bit line signal /S1, which is the output of the inverter IV62, becomes "low" level. In this condition, if any one of M word lines WL[M-1:0] is activated on "high" level, the corresponding NMOS transistor NM64, NM66 or NM68 is turned on so that the dummy bit line DUBL becomes "low" level and the inverted dummy bit line signal /S1 (that is the output of the inverter IV62) becomes "high" level.

In the read operation of the data stored in the memory cell 10, the sense amplifier 20 is activated by the high level of sense enable signal SE, so as to sense and amplify the difference in voltages between the storage node N1 and the storage node N2, through the bit line BL and the inverted bit line /BL, and then produce its result through the output node DOUT.

In the write operation of the data to the storage nodes N1 and N2 of the memory cell 10, the NMOS transistor NM7 is turned on by the high level of the internal write signal WR applied to the gate thereof, so that the data bus line DBL is electrically coupled to the output of the CMOS inverter 40. In addition, the NMOS transistor NM5 is turned on by the high level of the column signal COL so that the data bus line DBL and the bit line BL is electrically coupled to each other. The access transistors NM13 and NM14 are also turned by the high level of word line signal. Accordingly, the output data of the CMOS inverter 40 is transferred to the storage node N1 through the NMOS transistor NM7, the data bus line DBL, the NMOS transistor NM5, the bit line BL and the access NMOS transistor NM13. Similarly, the NMOS transistor NM8 is turned on by the high level of the internal write signal WR which is applied to the gate thereof, so that the output of the CMOS transistor 30 is electrically coupled to the inverted data bus line /DBL. In addition, the NMOS transistors NM6 and NM14 are turned due to the high level of the column signal COL and the word line signal, respectively, so that the inverted data bus line /DBL, the inverted bit line /BL and the storage node N2 are electrically coupled to one other. Accordingly the output data of the CMOS inverter 30 is transferred to the storage node N2 through the NMOS transistor NM8, the inverted data bus line /DBL, the NMOS transistor NM6, the inverted bit line /BL and the NMOS transistor NM14. Thus, the data of the storage nodes N1 and that of storage node N2 are different from each other.

In other words, when the CMOS inverter 30 receives the low level of data signal DIN, the storage node N1 stores a low level of data, while the storage node N2 stores a high level of data. In contrast, when the CMOS inverter 30 receives the high level of data signal DIN, the storage node N1 stores a "high" level data and the storage node N2 stores a "low" level data.

FIG. 2 illustrates a conventional control circuit for controlling the write operation of SRAM of the semiconductor memory device as described in FIG. 1.

Referring to FIG. 2, the conventional control circuit for semiconductor memory device comprises an address transition detector 50, an inverter IV1 and a NOR gate NR1. The address transition detector 50 detects the transition of the address signal AD[N-1:0] which is applied to the input thereof and produces a precharge signal PRE which is for precharging the bit line BL and the inverted bit line /BL. The inverter IV1 receives the write enable signal /WE, which can be externally applied thereto, so as to produce a write signal WR. The NOR gate NR1 receives the inverted dummy bit line signal /S1 and the output of the NOR gate NR2 and performs NOR-operation thereon to produce the result of NOR-operation.

In addition, the conventional control circuit for semiconductor memory device further comprises a NOR gate NR2 and an inverter IV2. The NOR gate NR2 receives and performs NOR-operation on the output signal of the address transition detector 50, the output signal of the inverter IV1 and the output signal of the NOR gate NR1 and produces the NOR-operation result as an X-decoder (not shown) enable signal XDEC_ENB which is used for making enable an X-decoder(not shown) for receiving and decoding X-address of the memory. This X-decoder enable signal XDEC_ENB is buffered by a buffer 70. The inverter IV2 inverts the X-decoder enable signal XDEC_ENB to produce a sense enable signal SE which is for activating the sense amplifier 20 of FIG. 1. Here, the buffer 70 includes even number of inverters IV3 and IV4. Here, the prefix "/" or the suffix "B" of a reference character for signal represent that the signal is a low active signal.

In addition, the word line signal generator receives the address signal AD[N-1:0] and the X-decoder enable signal XDEC_ENB and produces a plurality of word line signals WL[M-1:0]. When the X-decoder enable signal XDEC_ENB is "0" (that is, "low" level), any one of M word lines is selectively activated to "high" level. Alternatively, when the X-decoder disable signal is "1" (that is, "high" level), all of the word line WL[M-1:0] are disabled to "low" level.

FIGS. 3A and 3B illustrate the waveforms of the signals of FIG. 2, during read operation and write operation, respectively.

The operation of the conventional control circuit for semiconductor memory device will be explained during read operation, with reference to FIG. 3A.

In FIGS. 3A and 3B, reference character /WE, AD, PRE, $XDEC_{13}$ ENB, SE, WL and /S1 represent the write enable signal, the address signal, the precharge signal, X-decoder enable signal, the sense enable signal, word line signal and the dummy bit line signal, respectively.

Referring to FIG. 3A, when any bit of multiple bits of the address signal AD makes the transition from high to low or the transition from low to high, the address transition detector 50 produces a high level of precharge signal PRE which has a predetermined pulse duration. That is, the precharge signal PRE makes the transition from high level to low level after the predetermined time elapses. Then, the precharge signal PRE from the address transition detector 50 maintains a low level until the address signal AD makes again any transition.

Subsequently, when the address transition detector 50 produces a high level signal, the dummy bit line unit 60 produces a low level of the inverted dummy bit line signal /S1 to the NOR gate NR1. The NOR gate NR2 produces a low level signal feedback to the NOR gate NR1 in response to the high level of the precharge signal PRE, so that the NOR gate NR1 produces a high level signal.

Here, the output node Y of the NOR gate NR2 and the output node X of the NOR gate NR1 continuously maintain their level even after the precharge signal PRE returns to the low level.

Thus, during the high duration of the precharge signal, the X-decoder enable signal XDEC_ENB from the buffer 70 is "low" level and the sense enable signal SE from the inverter IV2 is "high" level.

Then, while the X-decoder enable signal XDEC_ENB is low, a word line signal WL selected in response to the address signals AD [N-1:0] makes the transition from low level to high level, which turns on the access NMOS transistors NM13 and NM14 of one selected memory cell 10. Thus, the potentials of the bit line BL and the inverted bit line /BL is developed according to the data of the selected memory cell and then amplified by the sense amplifier 20. The amplified data is transferred to the data output DOUT. The selected word line WL is "high", so that the inverted dummy bit line signal /S1 becomes "high" level. In response to the high state of the inverted dummy bit line signal /S1, the X-decoder enable signal XDEC_ENB becomes "high" level and the sense enable signal SE becomes "low" level. Then, due to the "high" level of X-decoder enable signal XDEC_ENB, all word line signal WL become "low" and the inverted dummy bit line signal /S1 also becomes "low" level.

In the read operation as described above, the needless power consumption is reduced by automatically turning off the sense amplifier 20 and by making the word line "low" level, after data reading from the selected memory cell, even though the duration of the address signal is unduly long maintained.

The write operation of the semiconductor memory device will be explained, with reference to FIG. 3B.

The inverter IV1 produces a high level of write signal WR, when a low level of the write enable signal /WE is externally applied thereto. Then, the buffer 70 produces a low level of X-decoder enable signal XDEC_ENB and the inverter IV2 produces a high level of sense enable signal SE. In other words, when the write enable signal /WE is "low", the X-decoder enable signal is always "low" irrespective of the precharge signal and the inverted dummy bit line signal /S1. Thus, as the write enable signal /WE, which is externally applied, is unduly long, the sense amplifier and the X-decoder are activated during unduly lengthen period, thereby increasing the power consumption.

On the other hand, when the data stored in the cell is "0" (or a "low" level) and the data to be written is "1" (or a "high" level), the current path is made from the power source VDD to the ground VSS through the static precharge NMOS transistor NM4, the inverted bit line /BL and the NMOS transistors NM6, NM8 and NM9, with needless power consumption. Also, since the internal write signal WR is not affected by the precharge signal PRE, when the external write enable signal /WE is "low" level and the precharge signal PRE is "high" level, the current through the NMOS transistors NM1 and NM2 is selectively passed to the following paths, in accordance with the data to be written: one path is composed of 3 NMOS transistors NM5, NM7 and NM10 and the other path is composed of 3 NMOS transistors NM6, NM8 and NM9. As a result, power is needlessly consumed.

In addition, during the "low" state of the write enable signal /WE, since the sense enable signal SE is "high", the sense amplifier is continuously activated even after data outputting, with needless power consumption.

As a result, as the duration of the "low" level of the write enable signal /WE in write operation is long, the internal write signal WR, which is affected only by the write enable signal /WE, should be maintained "high" level. Such unduly long "high" level duration of the write signal results in undesirable power consumption.

Therefore, the above conventional control circuit for semiconductor memory device requires the much current to be driven, so that it makes the much power consumption. Thus there is a problem that the above control circuit is difficult to be applied to a small electronic product such as a portable electronic product.

SUMMARY OF THE INVENTION

Accordingly, an object of the present invention is to provide a control circuit for semiconductor memory device which solves the above problem. In more detail, the control circuit for semiconductor memory device in accordance with the present invention requires less driving current to thereby reduce the power consumption, and it is applicable to a portable electronic product which less requires driving current.

In accordance with one preferred embodiment of the present invention to accomplish the above object, there is provided a semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active(e.g. "high" level) duration;

a dummy bit line unit for producing a dummy bit line signal in response to activation(e.g. "high" level) of at least one word line;

a pulse generator for generating a pulse, the pulse signal becoming active (e.g. "high" level) in response to both an activation (e.g. "low" level) of a write enable signal externally applied and a de-activation (e.g. "low" level) of the precharge signal, and the pulse signal having a second predetermined active duration;

a latch for producing a latch signal, the latch signal being reset in response to the precharge signal or the pulse signal and being set in response to the dummy bit line signal; and a write signal generator for producing a write signal, the write signal becoming active (e.g. "high" level) in response to the latch signal and becoming non-active (e.g. "low" level) in response to the latch signal, wherein the data externally applied is transferred to the memory cell through the bit line only when the write signal is active.

The latch may be a SR latch composed of two NOR gates and the semiconductor memory device may be static random access memory.

In addition, the semiconductor memory device further comprises: a first precharge MOS transistor whose source-drain path is coupled between a power signal VDD and the bit line; a second precharge MOS transistor whose source-drain path is coupled between the power signal VDD and the bit line; and element for producing a modified static precharge signal by delaying the latch signal, and wherein the first precharge MOS transistor is gated by the precharge signal; and the second precharge MOS transistor is gated by the modified static precharge signal.

The semiconductor memory device may further comprise a sense enable signal generator (e.g., which maybe composed of IV410, IV710, IV720) for producing a sense enable signal by delaying and inverting the latch signal. Also, it may further comprise an address decoder enable signal generator for producing an address decoder enable signal, the address decoder enable signal becoming active (e.g. "high" level) in response to the precharge signal and becoming non-active (e.g. "low" level) in response to the latch signal. Here, the word lines are selectively active only when the address decoder enable signal is active.

In addition, the dummy bit line unit may comprise: a precharge MOS transistor having a drain coupled to the power signal VDD and gated by the precharge signal; a dummy bit line having one end coupled to the source of the precharge MOS transistor; a first plurality of MOS transistors, each source-drain path being coupled between the dummy bit line and a ground and gated by a corresponding word line signal; a second plurality of MOS transistors whose source-drain paths being coupled in series between the other end of the dummy bit line and the ground, at least one second plurality of MOS transistors being gated by the write signal and the other second plurality of MOS transistors being gated by the power signal; and an inverter for inverting a signal of the dummy bit line.

In accordance with another preferred embodiment of the present invention, there is provided a semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal;

a modified static precharge signal generator for producing a modified static precharge signal by delaying the latch signal;

a first precharge MOS transistor whose source-drain path is coupled between a power signal and the bit line; and a second precharge MOS transistor whose source-drain path is coupled between the power signal and the bit line, wherein the first precharge MOS transistor is gated by the precharge signal and the second precharge MOS transistor is gated by the modified static precharge signal.

In accordance with still another preferred embodiment of the present invention, there is provided with a semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal;

a sense amplifier for sensing and amplifying the data of the bit lines; and a sense enable signal generator for producing a sense enable signal by delaying the latch signal with predetermined period, wherein the sense amplifier is enabled in response to the sense enable signal.

In accordance with still yet another preferred embodiment of the present invention, there is provided with a semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal; and an address decoder enable signal generator for producing an address decoder enable signal, the address decoder enable signal becoming active in response to the precharge signal and becoming non-active in response to the latch signal, wherein the word lines are selectively active only when the address decoder enable signal is active.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

Hereinafter, explained in details is about the invention referring to the attached diagrams.

Figure 4:
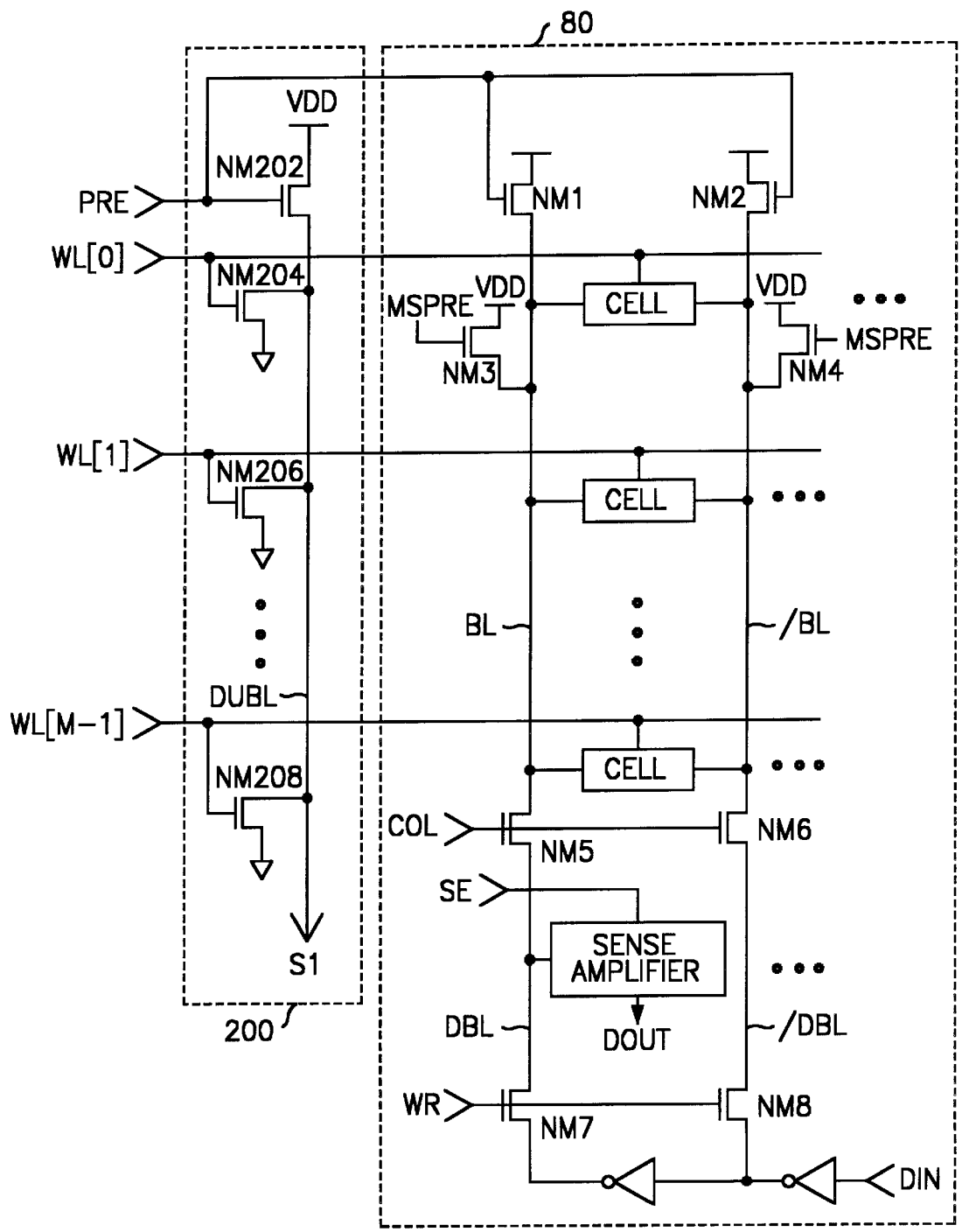
FIG. 4 is a circuit diagram of a semiconductor memory device, SRAM, including a dummy bit line unit, according to the present invention.

FIG. 4 is a circuit diagram of a semiconductor memory device, more specifically SRAM circuit, according to one preferred embodiment of the present invention. In FIG. 4, the diagram includes a dummy bit line unit.

Figure 1:
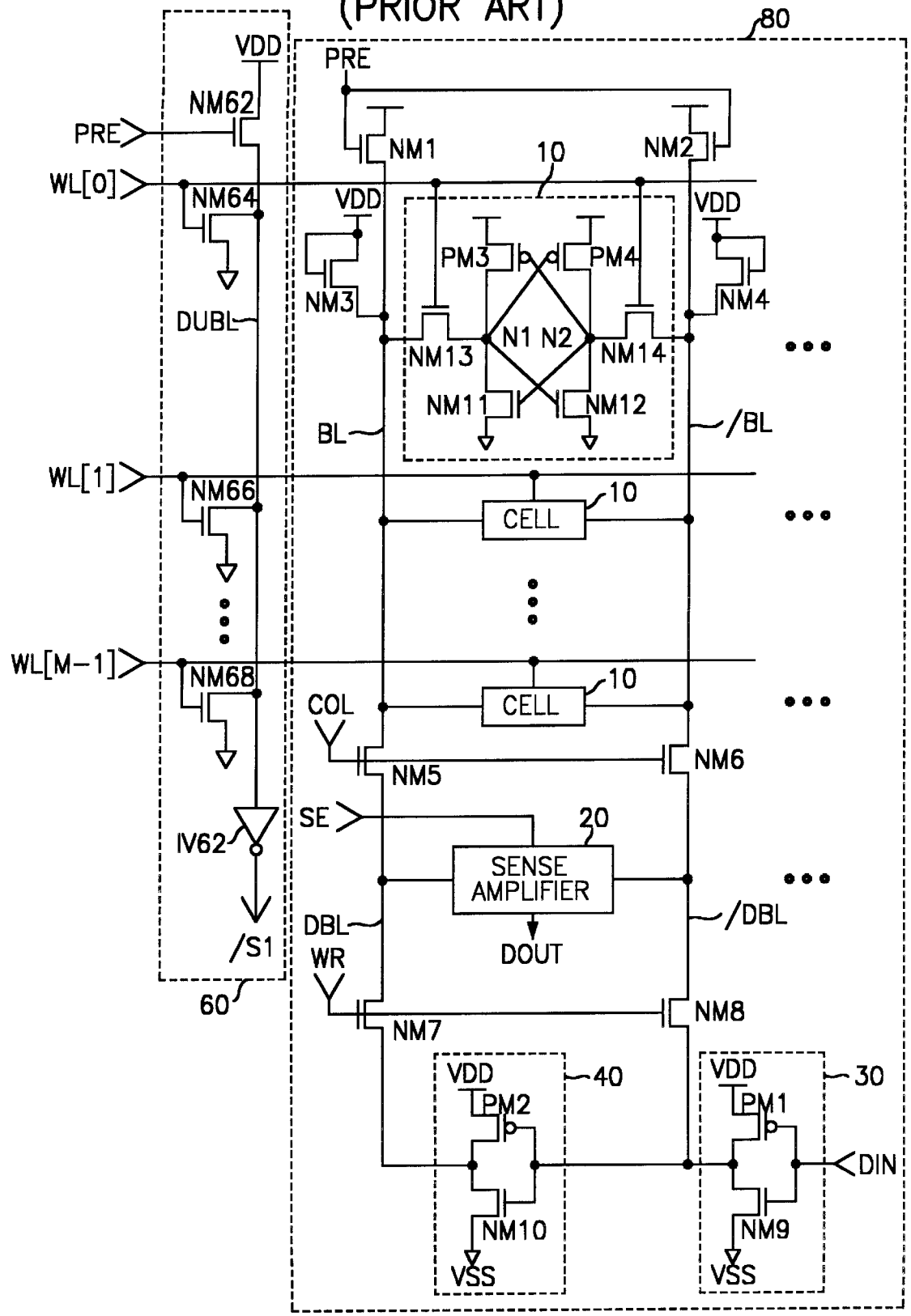
FIG. 1 is a circuit diagram of a semiconductor memory device, SRAM, including a dummy bit line unit.
Figure 2:
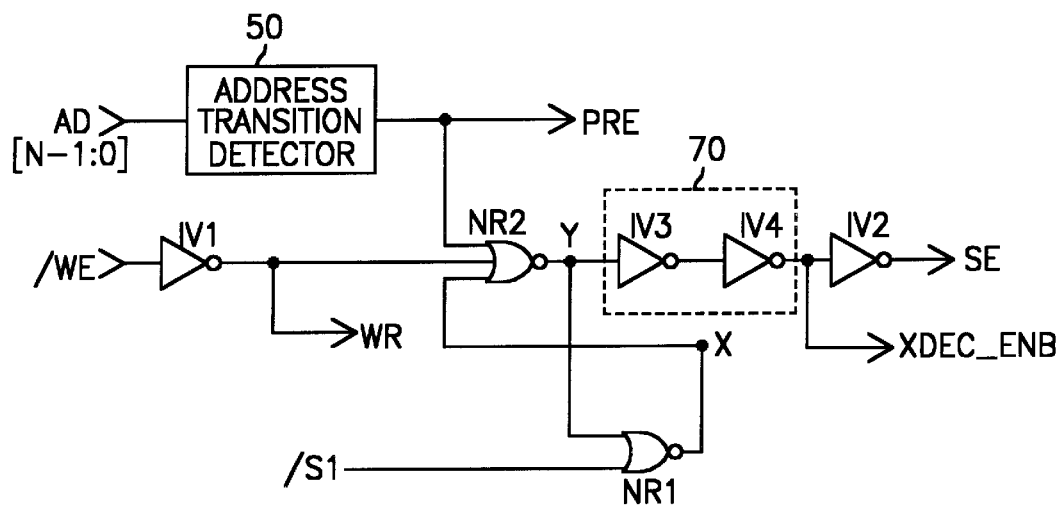
FIG. 2 illustrates a conventional control circuit for a semiconductor memory device.
Figure 3A:
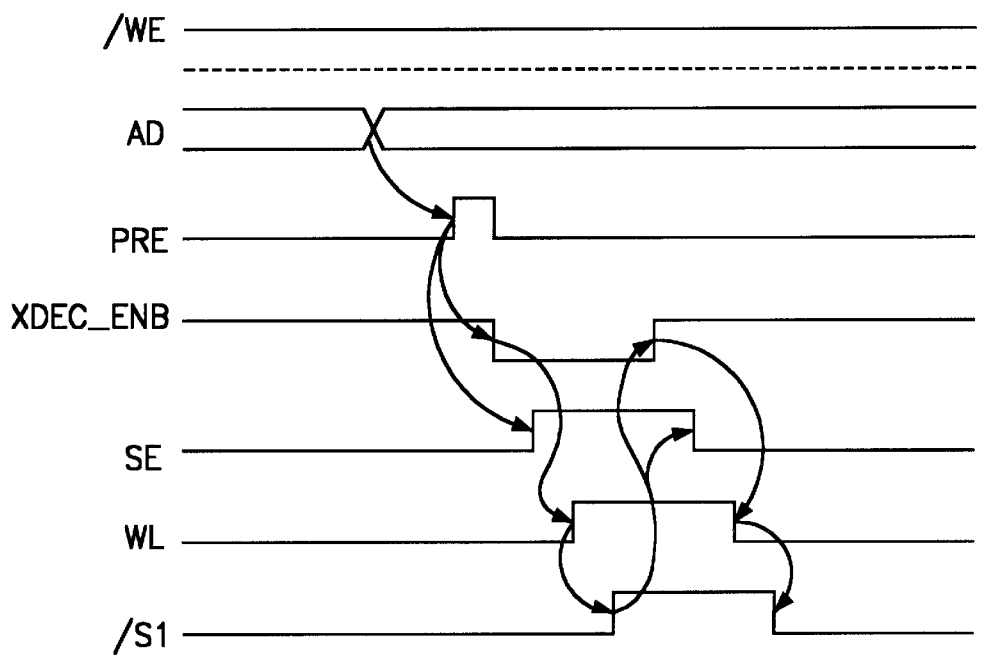
FIGS. 3A and 3B show waveforms of signals shown in FIG. 2, during reading and write operations, respectively.
Figure 3B:
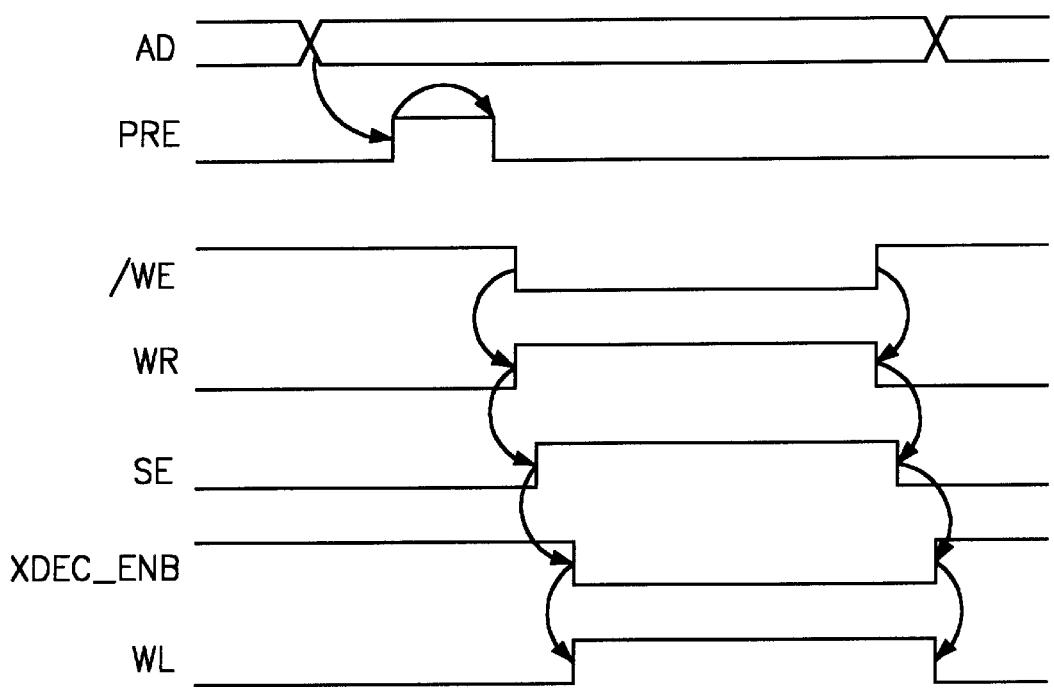

As shown in this drawing, the SRAM circuit according to the present invention is the same with that of FIG. 1, except that the dummy bit line unit 200 does not includes the inverter IV62 (see FIG. 1) coupled to the dummy bit line DUBL. Thus, the dummy bit line unit 200 produces the non-inverted dummy bit line signal S1. Also, the static precharge NMOS transistors NM3 and NM4 are gated by a modified static precharge signal MSPRE.

Figure 5:
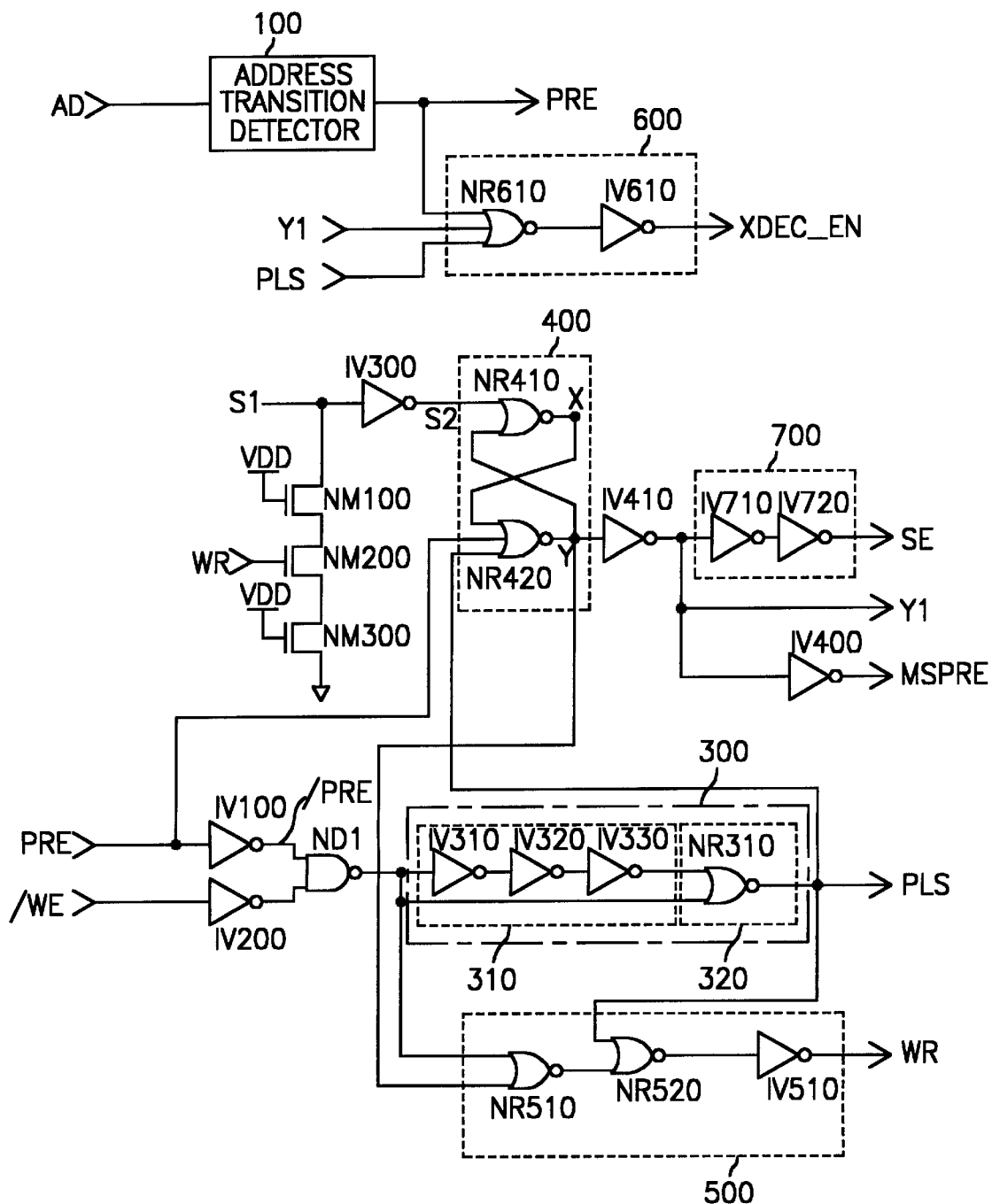
FIG. 5 illustrates a control circuit for semiconductor memory device in accordance with one embodiment of the present invention.

FIG. 5 illustrates a control circuit for semiconductor memory device shown in FIG. 4, in accordance with one embodiment of the present invention.

Referring to FIG. 5, the control circuit for semiconductor memory device in accordance with the present invention comprises an address transition detector 100, a pulse generator 300, a latch 400, a sense enable signal generator 700, a write signal generator 500 and an address decoder enable signal generator 600.

The address transition detector 100 detects transition of the address signal AD externally applied and produces a precharge signal PRE.

The control circuit for semiconductor memory device according to one embodiment of this invention, further comprises NMOS transistors NM100, NM200, and NM300. The source-drain paths of NMOS transistors NM100, NM200 and NM300 are coupled in series between the output node of the dummy bit line unit 200 and the ground VSS. Also, the gates of the NMOS transistors NM100 and NM300 are applied with the power voltage VDD, and the gate of the NMOS transistor NM200 is applied with the write signal WR. Thus, when the write signal WR is in a high level, the input of the inverter IV300 is grounded. Here, the dummy bit line unit may comprise the block 200 of FIG. 4 and the NMOS transistors NM100, NM200, NM300 and the inverter INV300 of FIG. 5. In such a configuration, the dummy bit line unit produces the inverted dummy bit line signal S2. The inverter IV300 provides its output S2 to the latch 400.

Also, the precharge signal PRE is applied to the latch 400. The latch 400 generates a latch signal Y based on the precharge signal PRE, the output S2 of the inverter IV300 and the output PLS of the pulse generator 300. The latch signal y is delayed and inverted by means of the inverters IV410, IV710 and IV720, so as to be the sense enable signal SE. The inverter IV410 also inverts the latch signal Y so as to produce a control signal Y1 and the inverter IV400 inverts the output of the inverter IV410, so as to produce the modified static precharge signal MSPRE. The sense enable signal SE, the control signal Y1 and the modified static precharge signal MSPRE are applied to the sense amplifier, the address decoder enable signal generator 600, the gates of the static precharge NMOS transistors NM3 and NM4.

More specifically, the latch 400 comprises two NOR gates NR410 and NR420. The NOR gate NR410 is coupled for receiving the output of the inverter IV300 and the output of the NOR gate NR420. The NOR gate NR420 is coupled for receiving the output of the NOR gate NR410, the precharge signal PRE and the pulse signal PLS. That is, the NOR gates NR410 and NR420 constitute a SR latch circuit and the output of the NOR gate 420 is produced as a latch signal Y. Thus, the latch signal Y is reset to "low" level in response to "high" level of the precharge signal PRE or "high" level of the pulse signal PLS and set to "high" level in response to "high" level of the inverted dummy bit line signal S2 (or the "low" level of the dummy bit line signal S1), which is output of the inverter IV300. The output of the NOR gate NR420 is also applied to the inverter IV410 so as to be inverted.

The control circuit further comprises 2 inverters IV100 and IV200 and a NAND gate ND1. The inverted precharge signal /PRE from the inverter IV100 is applied to one input of the NAND gate ND1. The inverter IV200 inverts the write enable signal /WE so as to provide it to the other input of the NAND gate ND1. The NAND gate ND1 performs a NAND-operation to produce the NAND-operated result to the pulse generator 300 and the write enable signal generator 500.

The pulse signal generator 300 produces a predetermined pulse-width pulse signal PLS, in response to the output of the NAND gate ND1. The "high" state duration of the pulse signal PLS can be controlled by the number of the series-connected inverters IV310, IV320 and IV330. The pulse generator 300 includes a delay element 310 and a pulse-generating gate 320. The delay element 310 includes a plurality of inverters IV310, IV320 and IV330 coupled in series between the output of the NAND gate ND1 and the input of the pulse generating gate 320 and delays the output of the NAND gate ND1. The pulse generating gate 320 includes a NOR gate NR310 whose inputs are coupled for receiving both the output of the delay element 310 and the output of the NAND gate ND1.

The write signal generator 500 receives the latch signal Y, the output signal of the NAND gate ND1 and the pulse signal PLS, thereby producing the write signal WR.

The write signal generator 500 comprises two NOR gate NR510 and NR520, and an inverter IV510. The NOR gate NR510 is coupled for receiving the output of the NAND gate ND1 and the output of the NOR gate 420 and the NOR gate NR520 is coupled for receiving the output of the NOR gate NR510 and the pulse signal PLS. The inverter IV510 inverts the output of the NOR gate NR520 and produces the inverted result as the write signal WR.

The address decoder enable signal generator 600 receives the precharge signal PRE, the control signal Y1 and the pulse signal PLS, so as to produce an X-decoder enable signal XDEC_EN ("high" level active signal). The address decoder enable signal generator 600 comprises a NOR gate NR610 and an inverter IV610. The NOR gate NR610 is coupled for receiving the precharge signal PRE, the control signal Y1 and the pulse signal PLS and the inverter IV610 is coupled for inverting the output of the NOR gate NR610 to produce an X-decoder enable signal XDEC_EN (which corresponds to an address decoder enable signal, in the appended claims).

The write operation of the control circuit for semiconductor memory device as described above will be explained.

When a transition of the address signal AD is achieved and the write enable signal /WE externally applied becomes low level, the address transition detector 100 detects the transition so as to produce a predetermined high level duration pulse of precharge signal PRE.

If the precharge signal PRE makes the transition from high level to low level with the write enable signal /WE in a low level, the pulse signal PLS generated from the pulse generator 300 becomes high level and after a predetermined time elapses, it becomes low.

Here, the node Y is reset to "low" level in response to either the "high" level precharge signal PRE or the "high" level pulse signal PLS. Since the rising edge of the precharge signal PRE generally precedes that of the pulse signal PLS, the node Y becomes "low" level in response to the rising edge of the precharge signal PRE. Also, the node Y is set to "high" level in response to the output of the inverter IV300. When the level of the node Y is "low" level, the control signal Y1 is "high" level. Also, the sense enable signal SE becomes "high" level and the modified static precharge signal MSPRE (the output of the inverter IV400) becomes "low" level.

The output of the NOR gate NR520 is reset to "low" level in response to the high level of the pulse signal PLS, so that the internal write signal WR is set to "high" level.

Similarly, the output of the NOR gate NR610 is reset to "low" level by the "high" level of the pulse signal PLS, which is in turn inverted by the inverter IV610 so at to produce the "high" level of X-decoder enable signal XDEC_EN.

If the X-decoder enable signal XDEC_EN is "high" level, at least one of the word lines WL[M-1:0] becomes activated or "higher" level and then the dummy bit line signal S1 becomes "low" level. Thus, the output S2 of the inverter IV300 becomes "high" level.

In the latch circuit composed of NR 410 and NR420, when PRE and PLS are "low" level, the node Y is set to "high" level in response to the "high" level signal S2, which is the output of the inverter IV300.

The "high" level of node Y is applied to the NOR gate NR510, which produces a "low" level signal. This "low" level signal of NR510 is logic-OR operated with the "low" level of PLS by means of NR520 and IV510, so that the internal write signal WR becomes "low" level. Thus, the de-activation of the internal write signal WR is affected by the word line activation through the signal path composed of the dummy bit line unit 200, the inverter IV300, the NOR gates NR410, NR420, NR510 and NR520, and the inverter IV510, with corresponding signal-path-delay.

The control signals Y1, the modified static precharge signal MSPRE and the sense enable signal SE are "low", "high" and "low", respectively, in response to the "high" level of the node Y. That is, the control signal Y1 and the sense enable signal SE are also de-activated, in response to the word line activation, with some delay. Similarly, the modified static precharge signal MSPRE becomes "high" level, in response to the word line activation with some delay.

The XDEC_EN signal becomes "low" in the condition that PRE, Y1 and PLS all are "low". Generally, the falling edge of Y1 is lastly made among those of three signals PRE, Y1, PLS, so that the falling of XDEC_EN is affected by the falling of Y1 (in other words, the word line activation).

Since the conventional control circuit is affected only by the write enable signal /WE which is externally applied, as the low state duration of the write enable signal /WE is longer, so the high state duration of the write signal WR is longer.

However, even though the low state duration of the write enable signal /WE becomes longer, the write signal WR in the control circuit n accordance with the present invention becomes low after writing a data to a cell because the duration of the write signal WR is self-controlled. Thus the NMOS transistors NM7 and NM8 are turned off, so that disconnection is made in the current paths to thereby reduce the power consumption. Here, one disconnected current path is from the power voltage VDD through the precharge NMOS transistors NM1 or NM3, the bit line BL, the NMOS transistors NM5, the data bus line DBL, and the NMOS transistors NM7 and NM10 to the ground VSS, and the other disconnected current path is from the power voltage VDD through the precharge NMOS transistors NM2 or NM4, the inverted bit line /BL, the NMOS transistor NM6, the inverted data bus line /DBL and the NMOS transistors NM8 and NM9 to the ground VSS.

Also, in the control circuit according to one embodiment of the present invention, since sense enable signal SE becomes low, the sense amplifier is not required to be activated during the entire low state duration of the write enable signal /WE so that the current consumption after the data writing to a cell should be prevented.

In addition, the static precharge NMOS transistors NM3 and NM4 are gated by the modified static precharge signal MSPRE. Thus, the static precharge transistors NM3 and NM4 are turned off, in response to the rising of the precharge signal PRE, with some delay, and turned on in response to the word line activation, with some delay.

Accordingly, the control circuit according to one embodiment of the present invention can minimize the current loss by automatically sensing that the data writing onto a cell is made and controlling the duration of the write signal.

As described above, the active duration of the signals (e.g. the write signal WR, the sense enable signal SE and the modified static precharge signal MSPRE, etc.) related to write operations are controlled not by auto-pulse-generating-element (e.g. series-connected inverters) but the de-activation of the word line. Thus, the characteristics of the circuit should be prevented from being changed due to the variation of fabrication.

Figure 6:
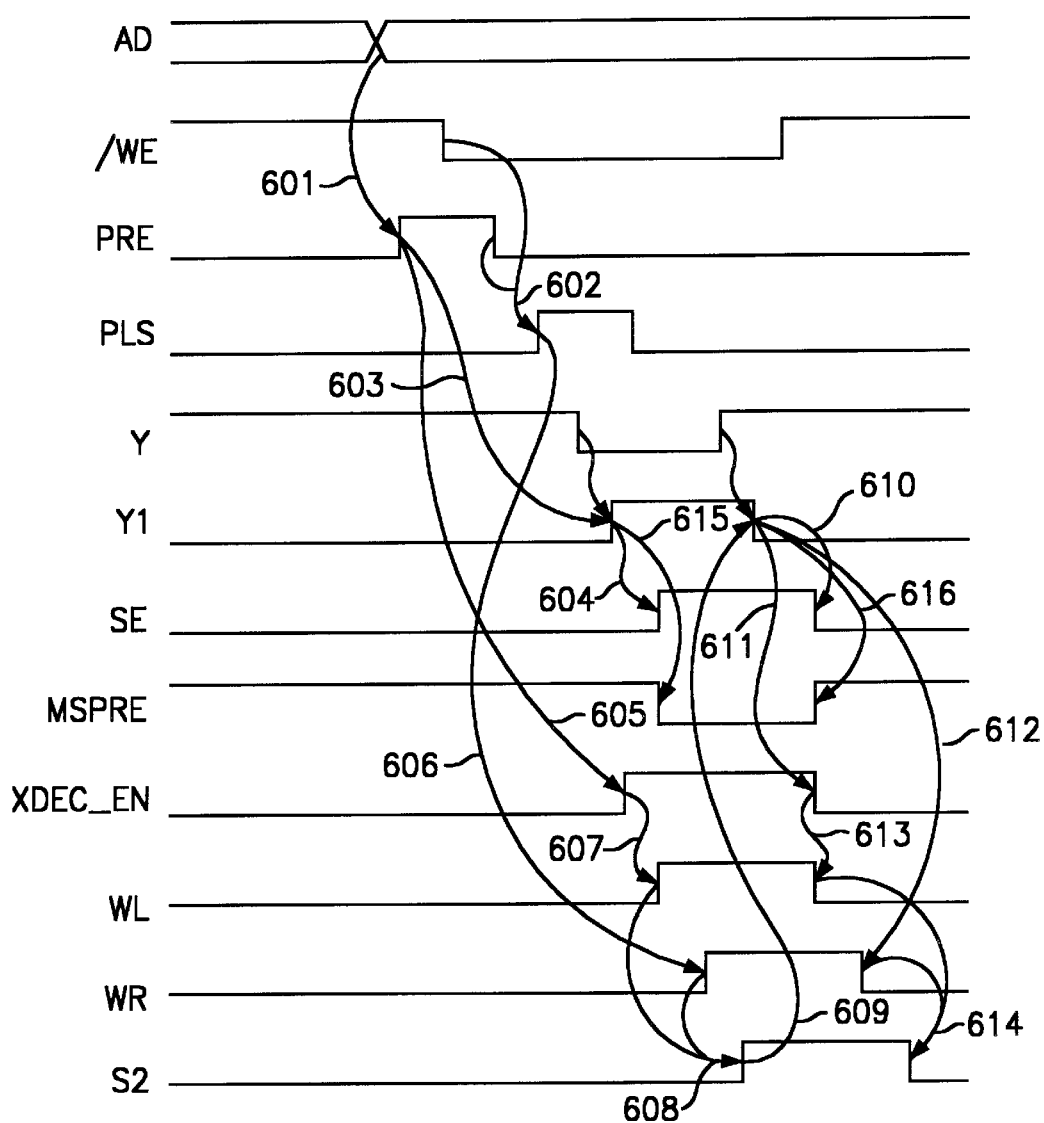
FIG. 6 shows waveforms of signals shown in FIG. 4, which illustrates the writing operation of the semiconductor memory device in accordance with one embodiment of the present invention.

FIG. 6 shows waveforms of signals shown in FIG. 5, when data writing. The write operation of the semiconductor memory device in accordance with the present invention will be again explained, referring to this figure. In FIG. 6, reference characters AD, /WE, PRE, PLS, Y, Y1, SE, MSPRE, XDEC_EN, WL, WR and S2 represent the address signal, the write enable signal, the precharge signal, the pulse signal, the node Y signal which is the output of the latch, the control signal, the sense enable signal, the modified static precharge signal, the X-decoder enable signal, the word line signal, the internal write signal and the output signal of the inverter IV300, respectively.

When the transition of the address signal AD is achieved, the precharge signal PRE becomes a high state (see 601) during a predetermined period. Then, if the write enable signal /WE makes the transition low from high and the precharge signal makes the transition from high to low, the pulse signal PLS makes the transition from low level to high level (see 602).

When the precharge signal PRE makes the transition from low to high, the control signal Y1 makes the transition from low to high (see 603), subsequently the sense enable signal SE becomes "high" level (see 604). The X-decoder enable signal XDEC_EN becomes "high" level in response to the rising of the precharge signal PRE (see 605) and the write signal WR becomes "high" level in response to the rising of the pulse signal PLS (see 606), with corresponding delays.

If the X-decoder enable signal XDEC_EN becomes high as such, the word line signal WL makes the transition from low to high (see. 607). The output signal S2 of the inverter IV300 coupled to the output of the dummy bit line unit 200 makes the transition from low to high, in response to either the rising of the word line signal WL or the internal write signal WL (see 608).

If the signal S2 becomes high as above, the control signal Y1 makes the transition from high to low (see 609) and then the sense enable signal SE, the X-decoder enable signal XDEC_EN and the write signal WR make the transition from high to low, respectively, with some delays (see 610, 611 and 612).

As describes above, if the X-decoder enable signal XDEC_EN becomes low, the word line signal makes the transition from high to low (see 613), and the output signal S2 of the inverter IV300 coupled to the output of the dummy bit line unit 200 makes the transition from high to low (see 614).

Figure 7:
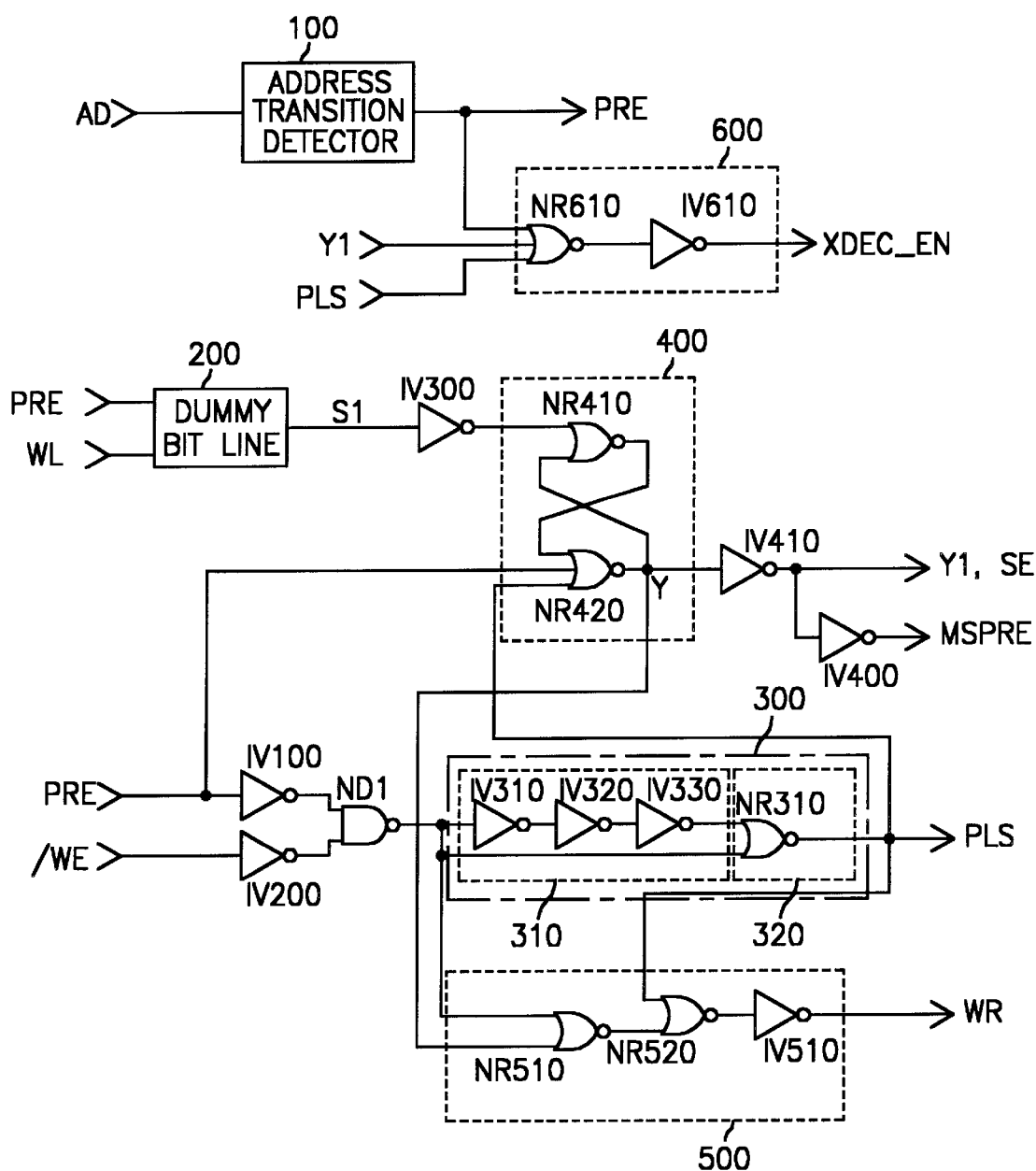
FIG. 7 illustrates a control circuit for semiconductor memory device in accordance with another embodiment of the present invention.

FIG. 7 illustrates a control circuit for semiconductor memory device in accordance with another embodiment of the present invention, which is used for a SRAM having small capacity.

Referring to FIG. 7, the control circuit for a SRAM having small. capacity in accordance with the present invention, comprises an address transition detector 100, a dummy bit line unit 200, a NAND gate ND1, a pulse generator 300, a latch 400, a write signal generator 500 and an address decoder enable signal generator 600.

The control circuit of FIG. 7 omits the NMOS transistors NM100, NM200 and NM300, and the inverters IV710 and IV720, with the comparison of the control circuit of FIG. 5. The output of the inverter IV410 is used as both the control signal Y1 and the sense enable signal SE and the output of the inverter IV400 is applied to the gates of the static precharge NMOS transistors as the modified static precharge signal MSPRE.

Also, since the operation of the control circuit of FIG. 7 is similar to that of FIG. 5, the detailed description thereof will be omitted.

The following table shows the current consumption of the semiconductor memory device in accordance with the present invention, compared with that of the conventional semiconductor memory device.

| Operation speed | 56 MHz | 37 MHz | 28 MHz |
|---|---|---|---|
| The current of the present invention | 46 mA | 42 mA | 40 MHz |
| The current of the conventional circuit | 43 mA | 30 mA | 23 Ma |
| The ratio of reduction | 7% | 29% | 43% |

As shown in the above table, the circuit of the present invention reduces the current consumption by about 7–43% according to the operation speed, compared with the conventional circuit. Also, the reduction ratio is increased as the operation speed is lowered.

As describe above, the control circuit in accordance with the present invention controls the high state duration of the write signal by using a pulse whose pulse width is self-controlled to thereby sensing whether the writing a data onto a cell is made. Thus, the control circuit minimizes the current loss in writing operation of semiconductor memory device, so that it can be applied to a potable electronic device which requires small current.

Although preferred embodiments of the present invention has been illustrated and described, various alternatives, modifications and equivalents maybe used. Therefore, the foregoing description should not be taken as limiting the scope of the present invention which is defined by the appended claims.

What is claimed is:

1. A semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal; and a write signal generator for producing a write signal, the write signal becoming active in response to the latch signal and becoming non-active in response to the latch signal, wherein the data externally applied is transferred to the memory cell through the bit line only when the write signal is active.

2. The semiconductor memory device in accordance with the claim 1, wherein said latch is a SR latch composed of two NOR gates.

3. The semiconductor memory device in accordance with the claim 1, wherein said semiconductor memory device is static random access memory.

4. The semiconductor memory device in accordance with the claim 1, further comprising:

a first precharge MOS transistor whose source-drain path is coupled between a power signal VDD and the bit line;

a second precharge MOS transistor whose source-drain path is coupled between the power signal VDD and the bit line; and means for producing a modified static precharge signal by delaying the latch signal, and wherein said first precharge MOS transistor is gated by the precharge signal; and said second precharge MOS transistor is gated by the modified static precharge signal.

5. The semiconductor memory device in accordance with the claim 1, further comprising a sense enable signal generator for producing a sense enable signal by delaying and inverting the latch signal.

6. The semiconductor memory device in accordance with the claim 1, further comprising an address decoder enable signal generator for producing an address decoder enable signal, said address decoder enable signal becoming active in response to the precharge signal and becoming non-active in response to the latch signal.

7. The semiconductor memory device in accordance with the claim 6, wherein said word lines are selectively active only when the address decoder enable signal is active.

8. The semiconductor memory device in accordance with the claim 1, wherein said dummy bit line unit comprises:

a precharge MOS transistor having a drain coupled to the power signal VDD and gated by the precharge signal;

a dummy bit line having one end coupled to the source of the precharge MOS transistor;

a first plurality of MOS transistors, each source-drain path being coupled between the dummy bit line and a ground and gated by a corresponding word line signal;

a second plurality of MOS transistors whose source-drain paths being coupled in series between the other end of the dummy bit line and the ground, at least one second plurality of MOS transistors being gated by the write signal and the other second plurality of MOS transistors being gated by the power signal; and an inverter for inverting a signal of said dummy bit line.

9. A semiconductor memory device including a memory cell array composed of a plurality of memory cells, a plurality of word lines or selectively accessing the memory cell, a plurality of bit lines or loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal;

a modified static precharge signal generator for producing a modified static precharge signal by delaying the latch signal;

a first precharge MOS transistor whose source-drain path is coupled between a power signal and the bit line; and a second precharge MOS transistor whose source-drain path is coupled between the power signal and the bit line, wherein the first precharge MOS transistor is gated by the precharge signal and the second precharge MOS transistor is gated by the modified static precharge signal.

10. The semiconductor memory device in accordance with the claim 9, further comprising a sense enable signal generator for producing a sense enable signal by delaying and inverting the latch signal.

11. The semiconductor memory device in accordance with the claim 9, further comprising an address decoder enable signal generator for producing an address decoder enable signal, said address decoder enable signal becoming active in response to the precharge signal and becoming non-active in response to the latch signal.

12. The semiconductor memory device in accordance with the claim 11, wherein said word lines are selectively active only when the address decoder enable signal is active.

13. The semiconductor memory device in accordance with the claim 9, wherein said dummy bit line unit comprises:

a precharge MOS transistor having a drain coupled to the power signal VDD and gated by the precharge signal;

a dummy bit line having one end coupled to the source of the precharge MOS transistor;

a first plurality of MOS transistors, each source-drain path being coupled between the dummy bit line and a ground and gated by a corresponding word line signal; and an inverter for inverting a signal of said dummy bit line.

14. The semiconductor memory device in accordance with the claim 13, wherein said dummy bit line unit further comprises:

a second plurality of MOS transistors whose source-drain paths being coupled in series between the other end of the dummy bit line and the ground, at least one second plurality of MOS transistors being gated by the write signal and the other second plurality of MOS transistors being gated by the power signal.

15. The semiconductor memory device in accordance with the claim 9, wherein said semiconductor memory device is static random access memory.

16. A semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal;

a sense amplifier for sensing and amplifying the data of the bit lines; and a sense enable signal generator for producing a sense enable signal by delaying the latch signal with predetermined period, wherein said sense amplifier is enabled in response to the sense enable signal.

17. A semiconductor memory device including a memory cell array composed of a plurality of memory cells, a plurality of word lines for selectively accessing the memory cell, a plurality of bit lines for loading data to/from the memory cell, comprising:

an address transition detector for detecting a transition of an address signal externally applied thereto and producing a precharge signal having a first predetermined active duration;

a dummy bit line unit for producing a dummy bit line signal in response to an activation of at least one word line;

a pulse generator for generating a pulse, the pulse signal becoming active in response to both an activation of a write enable signal externally applied and a de-activation of the precharge signal, and the pulse signal having a second predetermined active duration;

a latch for producing a latch signal, the latch signal being reset in response to the precharge signal or the pulse signal and being set in response to the dummy bit line signal; and an address decoder enable signal generator for producing an address decoder enable signal, said address decoder enable signal becoming active in response to the precharge signal and becoming non-active in response to the latch signal, wherein said word lines are selectively active only when the address decoder enable signal is active.

* * * * *